(12) United States Patent
Sharfi

(10) Patent No.: US 10,045,462 B2
(45) Date of Patent: Aug. 7, 2018

(54) ISOLATING LIQUID COOL SHOCK PROTECTION

(71) Applicant: Benjamin K. Sharfi, Rancho Cucamonga, CA (US)

(72) Inventor: Benjamin K. Sharfi, Rancho Cucamonga, CA (US)

(*) Notice: Subject to any disclaimer, the term of this patent is extended or adjusted under 35 U.S.C. 154(b) by 0 days.

(21) Appl. No.: 15/674,816

(22) Filed: Aug. 11, 2017

(65) Prior Publication Data

US 2018/0049344 A1 Feb. 15, 2018

Related U.S. Application Data

(60) Provisional application No. 62/373,704, filed on Aug. 11, 2016.

(51) Int. Cl.
*H05K 7/20* (2006.01)
*H05K 5/00* (2006.01)

(52) U.S. Cl.
CPC ....... *H05K 7/20236* (2013.01); *H05K 5/0056* (2013.01); *H05K 7/20254* (2013.01); *H05K 7/20454* (2013.01); *H05K 5/006* (2013.01)

(58) Field of Classification Search
CPC .......... H05K 7/20236; H05K 7/20218; H05K 7/20354; H05K 7/20927; H05K 5/0056; H05K 5/006
USPC ......... 361/699, 701–702, 760, 764; 257/714, 257/722; 165/80.4–80.5, 104.33
See application file for complete search history.

(56) References Cited

U.S. PATENT DOCUMENTS

| | | | | |
|---|---|---|---|---|
| 5,562,146 A | * | 10/1996 | Harmon | B22D 19/0063 164/112 |
| 9,041,196 B2 | * | 5/2015 | Bayerer | H01L 23/049 257/678 |
| 2005/0133237 A1 | | 6/2005 | Chen et al. | |
| 2006/0227515 A1 | * | 10/2006 | Enami | H01L 23/427 361/720 |
| 2007/0227697 A1 | | 10/2007 | Takahashi | |
| 2010/0148358 A1 | * | 6/2010 | Brunschwiler | H01L 21/4871 257/714 |
| 2013/0099368 A1 | | 4/2013 | Han | |
| 2013/0168057 A1 | * | 7/2013 | Semenic | F28D 15/0233 165/104.26 |
| 2013/0206375 A1 | | 8/2013 | Yoshida | |
| 2014/0225249 A1 | * | 8/2014 | Yoshihara | H01L 23/4334 257/714 |
| 2014/0307389 A1 | * | 10/2014 | Arvelo | B21D 53/04 361/702 |
| 2015/0097281 A1 | * | 4/2015 | Adachi | H01L 23/473 257/714 |

(Continued)

OTHER PUBLICATIONS

Patent Cooperation Treaty (PCT) Application No. PCT/US2017/046540—International Search Report, dated Dec. 8, 2017.

(Continued)

*Primary Examiner* — Dion R Ferguson
*Assistant Examiner* — Amir Jalali
(74) *Attorney, Agent, or Firm* — Lott & Fischer, PL

(57) ABSTRACT

An assembly for electrical components that will protect the components from G force trauma. The assembly will also prevent overheating of the component parts due to the trauma through the use of a coolant that will be employed when the trauma impacts the assembly.

13 Claims, 2 Drawing Sheets

(56) References Cited

U.S. PATENT DOCUMENTS

2016/0108301 A1   4/2016   Shou

OTHER PUBLICATIONS

Patent Cooperation Treaty (PCT) Application No. PCT/US2017/046540—Written Opinion of the International Searching Authority (Korea), dated Dec. 8, 2017 (dated Dec. 11, 2017).

* cited by examiner

ISOLATING LIQUID COOL SHOCK PROTECTION

CLAIM OF PRIORITY

This application is being filed as a non-provisional patent application under 35 U.S.C. § 111(b) and 37 CFR § 1.53(c). This application claims priority under 35 U.S.C. § 111(e) to U.S. provisional patent applications Ser. No. 62/373,704 filed on Aug. 11, 2016, the contents of which are incorporated herein by reference.

FIELD OF INVENTION

The present invention relates to a shock protection system for electronic devices that includes a viscous fluid coolant to absorb the heat created as a result of shock as well as operational heat.

BACKGROUND OF THE INVENTION

Electronic devices in general, and computers in specific, are becoming increasingly compact and small in size. At the same time that they are getting smaller, they are also getting more powerful, in that they are capable of storing more information and processing data at greater speeds. One result of these two trends is that more heat is generated in a smaller space by such electronic devices.

If the heat is not sufficiently removed from an electronic device, then the build-up of heat within the device tends to have adverse effects. One adverse effect is that the device may tend to run more slowly. Another adverse effect is that the device may become damaged by attaining a temperature at which various components start to fail. Even if components don't fail, the time spent at an increased temperature tends to reduce the viable lifetime of many electronic components. Because of this, a great deal of attention has been paid to various methods by which electronics can be cooled.

However, many of these methods are not effective when the electronic device is disposed in an environment that is not particularly well-suited for such electronics. For example, when the environment is hotter, wetter, dustier, dirtier, or subjected to more vibration, shock, or rough handling than a typical office setting, additional cooling challenges are introduced. For example, electronic devices protected from such environments by being placed within ruggedized housings can be very difficult to cool, because the cooling system cannot compromise the integrity of the ruggedized housing that is protecting the electronic device from the environment.

The present invention is designed to maximize the protection of the electronic devices from both shock trauma and overheating.

SUMMARY OF INVENTION

The present invention comprises an electronic circuit assembly intended to enable electronic components to withstand high levels (i.e. high Gs) of instantaneous acceleration without degradation, failure or electronic shorting. The system utilizes a spring element and a viscous liquid for dampening and thermal transfer. The system isolates all electrically conductive elements from the viscous fluid to prevent electrical shorts and contamination.

The spring element is set up below the electronic components, with the spring element attached to a circuitry interface panel. The other side of the spring element is attached to the bottom portion of the assembly. The bottom portion has isolated cavities filled with the viscous fluid. The circuitry interface panel has pillars that extend downwards towards the bottom portion. These pillars are adapted to line up with the cavities of the bottom portion, such that when the circuitry interface panel is pushed downwards, the pillars are received by the cavities. The spring element is positioned between the bottom portion and the circuitry interface panel to absorb shock or vibrational impulses. Energy extracted from the impulses is converted to heat and motion in the viscous fluid. If the viscous fluid overflows out of the cavities due to the pillars entering the cavities, there are reservoirs adapted around the exterior where the circuitry interface panel will push down towards the bottom portion to receive the overflow viscous liquid.

DETAILED DESCRIPTION OF THE INVENTION

Figure 1:
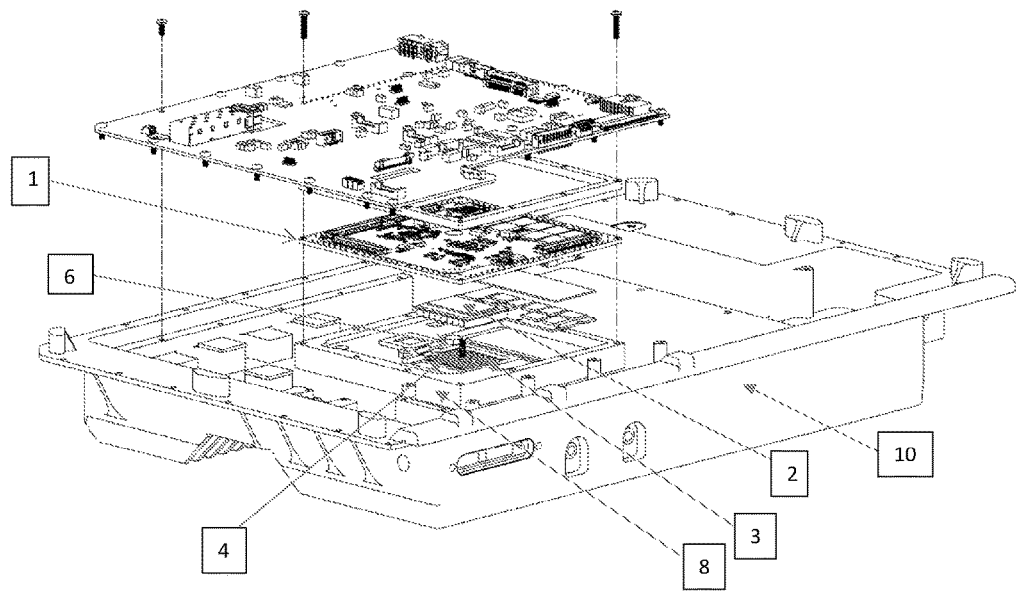
FIG. 1 is an exploded perspective view of one embodiment of the invention.
Figure 2:
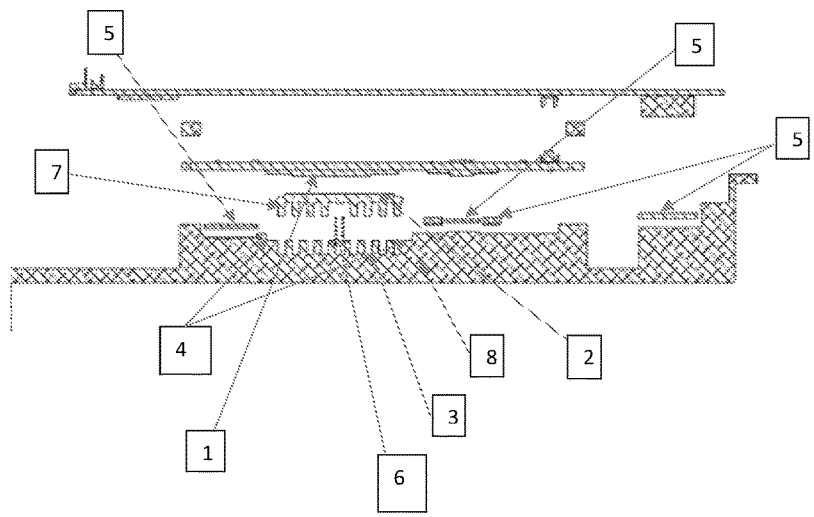
FIG. 2 is a side view of one embodiment of the invention.

FIGS. 1 and 2 show an example embodiment of an electronic circuit assembly that may be positioned inside a housing 10. The housing 10 may be configured to enclose an electronic component 1, a circuitry interface panel 2, and a base portion 8. The housing 10 may be configured to retain an electrical component 1, a circuitry interface panel 2, a coolant reservoir 4 and a spring element 6 to allow for heat transfer from the circuitry interface panel 2 to the housing 10. The housing 10 may be made of, or include, a thermoconductive material to protect the electronic circuit assembly from overheating. The electrical component 1 may be positioned atop the circuitry interface panel 2. The electrical component 1 is configured to accept the circuitry interface panel 2. Additionally, the circuitry interface panel 2 may be sealed onto the electrical component 1 with an epoxy resin to protect the circuitry interface panel 2 from shorts. The circuitry interface panel 2 may be a processor or any electronic circuit that performs operations on an external data source. The circuitry interface panel 2 may include a top portion and a bottom portion. The top portion may contain connectors that may be accepted by the electrical component 1. The bottom portion may include a plate. The plate may be made of a thermoconductive material and have a low thermal resistance so as to function as a heatsink at the circuitry interface panel 2. The plate may further include one or more pillars 7 (as shown in FIG. 2) that are designed to be accepted into one or more cavities 3 of the base portion 8 (described in further detail below).

The base portion 8 may be seated at a lower most portion of the housing 10. In some embodiments the housing 10 and base portion 8 may be of unitary construction. The base portion 8 may include one or more cavities 3, and a coolant reservoir 4. The one or more cavities 3 of the base portion 8 may contain a viscous fluid coolant that is intended to absorb heat and protect the circuitry interface panel 2 from damage caused by vibrational forces. The coolant may be any viscous fluid that can absorb heat. In some embodiments, the coolant can be a liquid silver compound. The one or more cavities 3 may have at least one cavity in linear alignment with the one or more pillars 7 of the plate. Additionally, the one or more cavities 3 of the base portion 8 are also configured to accept the one or more pillars 7 of the plate.

A spring element 6 having a distal end and a proximal end may be positioned between the bottom portion of the circuitry interface panel 2 and the base portion 8. The bottom portion of the circuitry interface panel 2 may be attachably seated on the distal end of the spring element 6, while the proximal end of the spring element 6 is positioned inside one of the one or more cavities 3. The spring element 6 protects the circuitry interface panel 2 from excessive movement caused by an external force. The spring element 6 also prevents the circuitry interface panel 2 from contacting the base portion 8. Further, the spring element 6 causes the electrical component 1 to revert back to an original position once the external force has been removed. The spring element 6 may be a helical spring, a leaf spring, or any other type of suitable spring.

As the circuitry interface panel 2 is lowered towards the base portion 8, the one or more pillars 7 mate with the one or more cavities 3 and the coolant is expelled from the one or more cavities 3. The coolant reservoir 4 is positioned about the perimeter of the circuitry interface panel 2, and is configured to capture any excess coolant expelled from the one or more cavities 3 as a result of the one or more pillars 7 mating with the one or more cavities 3. The one or more cavities 3 and the coolant may work in tandem to provide shock absorbing functionality in order to damp vibrational or shock impulses, and to protect the electronic circuit assembly. The dampened energy is converted to heat within the coolant, which protects the electronic circuit assembly from overheating.

As shown in FIG. 2, in addition to the above, the base portion 8 may also be made of, or include, thermal conductive material 5 to further protect the electronic circuit assembly from overheating.

Figure 3:
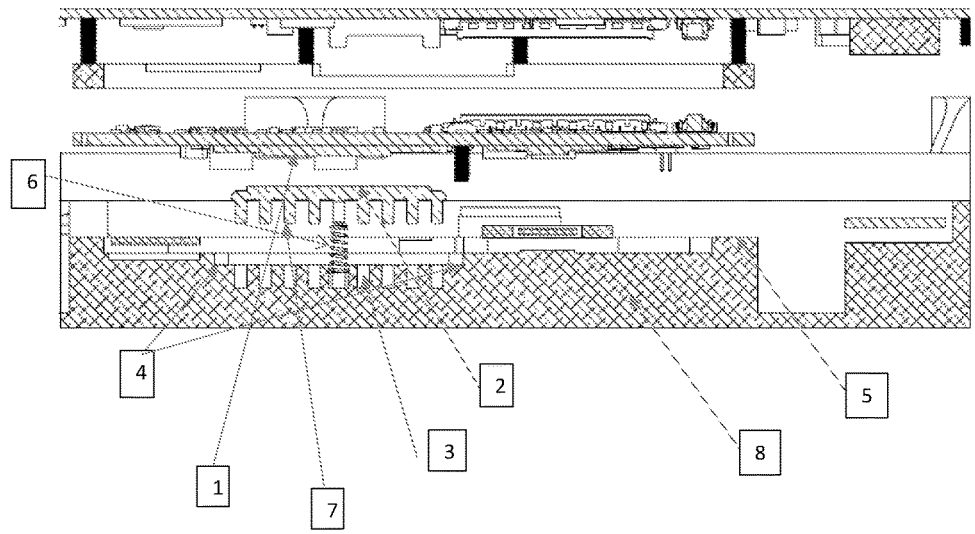
FIG. 3 is a side view of another embodiment of the invention.
Figure 4:
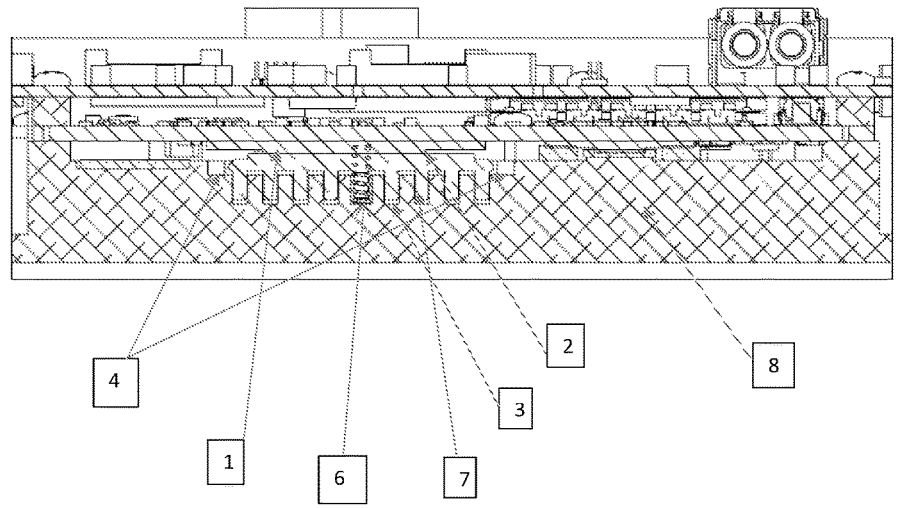
FIG. 4 is a side view of the invention after shock has been applied.

FIGS. 3 and 4 show example embodiments of the invention in an unaltered position (FIG. 3), and in a position where force is exerted (FIG. 4) on the electronic circuit assembly. As shown in these Figures, when a force is applied to the electronic circuit assembly, the circuitry interface panel 2 and the electrical component 1 move toward the base portion 8, which results in the contraction of the spring element 6. As the circuitry interface panel 2 moves closer to the base portion 8, the one or more pillars 7 mate with the one or more cavities 3. As the one or more pillars 7 mate with the one or more cavities 3, the liquid coolant within the one or more cavities 3 is slowly expelled from the one or more cavities 3 and absorbs the heat created by the movement caused by the force exerted on the electronic circuit assembly. If the one or more pillars 7 enter too far into the one or more cavities 3 such that the coolant begins to overflow, the coolant reservoir 4 is positioned on each side of the one or more cavities 3 to collect any excess overflow coolant. This prevents the coolant from overflowing and potentially damaging the electronic component 1 or another portion of the assembly.

The one or more pillars 7 may vary in length and all of the one or more pillars 7 in the same embodiment are not required to be the same length. Likewise, the one or more cavities 3 may have variable depths and all of the one or more cavities 3 in the same embodiment are not required to be the same depth. In the embodiments shown in FIGS. 1-4, there are an equal number of one or more pillars 7 and one or more cavities 3, though in other embodiments, an unequal number may be used. Moreover, although the embodiment illustrated in the Figures shows the one or more pillars 7 and corresponding one or more cavities 3 arranged in an array, the present invention is not limited to such an arrangement. The one or more pillars 7 and the one or more cavities 3 may be arranged in any of a number of patterns, other than an array, including as vertical or horizontal lines, concentric circles, or other concentric, or even eccentric geometric shapes.

Any reference in this specification to "one embodiment," "an embodiment," example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. An electronic circuit assembly comprising:
   an electrical component;
   a circuitry interface panel positioned underneath the electrical component;
   said circuitry interface panel having one or more pillars on the bottom of said interface panel and extending down away from the interface panel;
   a base portion having one or more cavities in linear alignment with said one or more pillars and adapted to receive said one or more pillars;
   a spring element disposed between said interface panel and said base portion; and
   said one or more cavities being at least partially filled with a viscous coolant.

2. The electronic circuit assembly of claim 1, wherein a coolant reservoir in fluid communication with said cavities is located on said base portion.

3. The electronic circuit assembly of claim 2, wherein said coolant reservoir is adapted to receive overflow coolant caused by the insertion of said pillars into said cavities.

4. The electronic circuit assembly of claim 1, wherein said pillars and cavities are adapted to displace said coolant out of said cavities by the insertion of said pillars into said cavities.

5. The electronic circuit assembly of claim 1, wherein when an outside force pushes said interface panel and said base portion toward each other, said pillars are mated with said cavities.

6. The electronic circuit assembly of claim 1, wherein said coolant is a liquid.

7. The electronic circuit assembly of claim 1, wherein said coolant is a liquid silver compound.

8. The electronic circuit assembly of claim 1, wherein there are an equal number of cavities and pillars.

9. The electronic circuit assembly of claim 1, wherein there are more cavities than pillars.

10. The electronic circuit assembly of claim 1, wherein all of said cavities have the same depth.

11. The electronic circuit assembly of claim 1, wherein at least two of said cavities have different depths.

12. The electronic circuit assembly of claim 1, wherein all of said pillars have the same length.

13. The electronic circuit assembly of claim 1, wherein at least two of said pillars have different lengths.

* * * * *